United States Patent
Inoue et al.

(10) Patent No.: US 6,812,505 B2
(45) Date of Patent: Nov. 2, 2004

(54) SEMICONDUCTOR DEVICE

(75) Inventors: Kaoru Inoue, Shiga (JP); Katsunori Nishii, Osaka (JP); Hiroyuki Masato, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/605,019

(22) Filed: Sep. 2, 2003

(65) Prior Publication Data
US 2004/0113158 A1 Jun. 17, 2004

Related U.S. Application Data

(62) Division of application No. 09/733,593, filed on Dec. 8, 2000, now Pat. No. 6,639,255.

(30) Foreign Application Priority Data
Dec. 8, 1999 (JP) .............................. 11-349330

(51) Int. Cl.[7] .............................................. H01L 29/737
(52) U.S. Cl. ...................................... 257/194; 257/192
(58) Field of Search ................................ 257/194, 192, 257/256, 279, 280, 282, 283, 285

(56) References Cited

U.S. PATENT DOCUMENTS 6,639,255 B2 * 10/2003 Inoue et al. ................. 257/194

* cited by examiner

Primary Examiner—Long Pham
(74) Attorney, Agent, or Firm—Snell & Wilmer LLP

(57) ABSTRACT

A semiconductor device includes: a substrate; a buffer layer including GaN formed on the substrate, wherein: surfaces of the buffer layer are c facets of Ga atoms; a channel layer including GaN or InGaN formed on the buffer layer, wherein: surfaces of the channel layer are c facets of Ga or In atoms; an electron donor layer including AlGaN formed on the channel layer, wherein: surfaces of the electron donor layer are c facets of Al or Ga atoms; a source electrode and a drain electrode formed on the electron donor layer; a cap layer including GaN or InGaAlN formed between the source electrode and the drain electrode, wherein: surfaces of the cap layer are c facets of Ga or In atoms and at least a portion of the cap layer is in contact with the electron donor layer; and a gate electrode formed at least a portion of which is in contact with the cap layer.

1 Claim, 9 Drawing Sheets

SEMICONDUCTOR DEVICE

CROSS REFERENCE TO RELATED APPLICATIONS

This application is a divisional application of U.S. Ser. No. 09/733,593, entitled "GAN-Based HFET Having a Surface-Leakage Reducing Cap Layer", filed Dec. 8, 2000, now U.S. Pat. No. 6,639,255 and which claims priority to Japanese Application No. 11-349330, filed Dec. 8, 1999.

BACKGROUND OF INVENTION

1. Field of the Invention

The present invention relates to a semiconductor device, and more particularly to a field-effect transistor having a heterostructure of a Gallium nitride-based semiconductor which is generally represented as $In_xAl_yGa_{1-x-y}N$ (where $0 \leq X \leq 1$, $0 \leq Y < 1$).

2. Description of the Related Art

A Gallium nitride-based semiconductor such as GaN, Al-GaN, InGan, InAGaN or the like has high dielectric breakdown field, high thermal conductivity and a high electron saturation velocity, and thus is promising as a material for a high-frequency power device. Particularly in a semiconductor device having an AlGaN/GaN heterojunction structure, electrons accumulate at a high density in a heterojunction interface between AlGaN and GaN, and a socalled two-dimensional electron gas is formed. This two-dimensional electron gas exists in a spatially separated state from donor impurities added to AlGaN, and thus shows high electron mobility. A field-effect transistor having such a heterostructure is produced so that source resistance can be reduced. Moreover, a distance d from a gate electrode to the two-dimensional electron gas is typically as short as tens of nm, and thus, even if a gate length Lg is as short as about 100 nm, the ratio of the gate length Lg to the distance d (i.e., aspect ratio) Lg/d, can be increased from 5 to about 10. Accordingly, semiconductor devices having a heterostructure have a superior feature in that a field-effect transistor which has an insignificant short-channel effect and satisfactory saturation property can be readily produced. Moreover, a two-dimensional electron of the AlGaN/GaN-based heterostructure has an electron velocity in a high field region of about $1 \times 10^5$ V/cm, which is twice or more than the speed of AlGaAs/InGaAs-heterostructure currently prevalent as a high-frequency transistor, and thus, is expected to be applied to high-frequency power devices.

A conventional semiconductor device 900 is shown in FIG. 9. The semiconductor device 900 is formed on a sapphire substrate or SiC substrate 901, on which the following layers are sequentially laminated: a buffer layer 902 including GaN; a channel layer 903 formed of GaN or InGaN; and an electron donor layer 904 including AlGaN. A source electrode 906, a gate electrode 907 and a drain electrode 908 are provided on the electron donor layer 904.

This AlGaN/GaN-based heterostructure is typically formed on a sapphire substrate or SiC substrate 901 composed of a (0001) facet (c facet), through a crystal growth process using a metal-organic chemical vapor deposition method or a molecular beam epitaxy method. In the case of forming the buffer layer 902 including GaN on the sapphire substrate or SiC substrate 901, it is necessary to thickly form the buffer layer 902 in order to account for a great difference in lattice constant between the substrate 901 and the buffer layer 902. This is because the strain due to a lattice mismatch between the buffer layer 902 and the substrate 901 is sufficiently reduced by forming the buffer layer 902 so as to have a relatively large thickness. By forming the electron donor layer 904 containing AlGaN to which n-type impurities such as Si or the like are added so as to have a thickness on the order of tens of nm on this thick buffer layer 902, a two-dimensional electron gas (i.e., channel layer 903) is formed in the buffer layer 902 which has a great electron affinity in the heterointerface between AlGaN and GaN due to the effects of selective doping. The crystal facet of a heterostructure formed by an MOCVD (metal-organic chemical vapor deposition) method, is typically composed of a facet of Ga, which is an III group element. This two-dimensional electron gas is susceptible to the effects of piezo-polarization in a c axis direction due to tensile stress imposed oni AlGaN, in addition to a difference in spontaneous polarization between AlGaN (included in the electron donor layer 904) and GaN (included in the buffer layer 902). Thus, electrons accumulate at a density which is higher than a value which would be expected from the density of the n-type impurities added to the electron donor layer 904. When Al composition of AlGaN of the electron donor layer 904 is 0.2 to 0.3, electron density of the channel layer 903 is about $1 \times 10^{13}/cm^2$, which is about 3 times the density of a GaAs-based device. Since the two-dimensional electron gas of such a high density is accumulated, the semiconductor device 900 used as a GaN-based heterostructure field-effect transistor (FET) is considered as a highly promising power device.

However, the conventional semiconductor device 900 has a number of problems as follows: (1) due to the imperfectness of crystal growth techniques and their associated processes, a satisfactory crystal can not be obtained; and (2) in the case of involving an etching process, the device properties may be deteriorated due to damage inflicted by the etching process, and thus, the expected power characteristics may not be sufficiently realized.

One of the problems related to the crystal growth is associated with the fact that the undoped GaN included in the buffer layer 902 typically represents an n-type and the carrier density may be as high as about $10^{16}/cm^3$ or more. This is presumably because the constituent nitrogen (N) atoms are released during the crystal growth, and thus, vacancies are liable to be formed. When there are such residual carriers, the leakage current component via the GaN buffer layer 902 of the device becomes greater. In particular, when operating the device at a high temperature, deteriorations in the element properties such as aggravation of pinch-off characteristics may occur. As for an isolation problem, when forming a plurality of GaN-based heterostructure FETs on the same substrate, the FETs interfere with each other to hinder normal operation. When the gate electrode 907 is further provided above this GaN buffer layer 902, a problem such as an increase of a gate leakage current, a drop in the voltage breakdown level of the device or the like may arise.

As for problems associated with etching process technique, a facet of GaN (included in the buffer layer 902) or AlGaN (included in the electron donor layer 904) may be damaged. Since GaN and AlGaN are difficult to remove or trim by means of wet etching, dry etching is typically performed for the etching process. However, a leakage current is likely to flow in the surface of the buffer layer 902 or the electron donor layer 904 due to the damage inflicted on the surface of the buffer layer 902 or the electron donor layer 904. It is considered that in particular, shortage of nitrogen on the surface increases the conductivity of the surface of the buffer layer 902 exposed by the etching, thereby increasing the leakage current.

SUMMARY OF INVENTION

In one aspect of the invention, a semiconductor device includes: a substrate; a buffer layer-including GaN formed on the substrate, wherein: surfaces of the buffer layer are c facets of Ga atoms; a channel layer including GaN or InGaN formed on the buffer layer, wherein: surfaces of the channel layer are c facets of Ga or In atoms; an electron donor layer including AlGaN formed on the channel layer, wherein: surfaces of the electron donor layer are c facets of Al or Ga atoms; a source electrode and a drain electrode formed on the electron donor layer; a cap layer including GaN or InGaAlN formed between the source electrode and the drain electrode, wherein: surfaces of the cap layer are c facets of Ga or In atoms and at least a portion of the cap layer is in contact with the electron donor layer;

and a gate electrode formed at least a portion of which is in contact with the cap layer.

In one embodiment of the invention, at least a portion of the gate electrode may be formed so as to contact the electron donor layer.

In another embodiment of the invention, the gate electrode may be formed on the cap layer.

In still another embodiment of the invention, the cap layer may include InGaAlN, the cap layer may have a composition which is substantially lattice matched with the buffer layer in a c facet and the electron donor layer may be formed so that an absolute value of a magnitude of a polarization occurring within the cap layer is smaller than that of a magnitude of a polarization occurring within the electron donor layer.

In still another embodiment of the invention, an n-type impurity may be added to part or whole of the cap layer.

In still another embodiment of the invention, the gate electrode may be positioned closer to the source electrode than to the drain electrode.

In still another embodiment of the invention, the gate electrode may have a surface area which is larger than that of the cap layer.

In still another embodiment of the invention, the gate electrode may be positioned in a region where the cap layer is reduced in thickness or removed.

In still another embodiment of the invention, the gate electrode may be formed on a side of the cap layer closer to the source electrode, and the cap layer may be formed between the gate electrode and the drain electrode.

In still another embodiment of the invention, the cap layer may include a semiconductor layer formed on the electron donor layer and an insulating film formed on the semiconductor layer.

The present invention having the above-described structure enhances a barrier height of Schottky junction, thereby providing a semiconductor device, which is capable of: reducing the leakage current as well as preventing an increase of the source resistance; and/or improving the voltage breakdown level as well as preventing an increase of the source resistance. Moreover, a region occupied by a cap layer between a gate electrode and a drain electrode is made larger. Such a structure allows the voltage breakdown level of a semiconductor device to be improved.

In one aspect of the invention, a semiconductor device includes: a substrate; a buffer layer including AlGaN formed on the substrate, wherein: surfaces of the buffer layer are c facets of N atoms; an electron donor layer including AlGaN formed on the buffer layer, wherein: surfaces of the electron donor layer are c facets of N atoms; a channel layer including GaN or InGaN formed on the electron donor layer, wherein: surfaces of the channel layer are c facets of N atoms; a source electrode and a drain electrode formed on the channel layer; a cap layer including AlGaN formed between the source electrode and the drain electrode, wherein: surfaces of the cap layer are c facets of N atoms and at least a portion of the cap layer is in contact with the channel layer; and a gate electrode formed at least a portion of which is in contact with the cap layer.

In one embodiment of the invention, the gate electrode may be formed so that at least a portion of which is in contact with the channel layer.

In another embodiment of the invention, the gate electrode may be formed on the cap layer.

In still another embodiment of the invention, the gate electrode may be positioned closer to the source electrode than to the drain electrode.

In still another embodiment of the invention, the gate electrode may have a surface area which is larger than that of the cap layer.

In still another embodiment of the invention, the gate electrode may be positioned in a region where the cap layer is reduced in thickness or removed.

In still another embodiment of the invention, the gate electrode may be formed on a side of the cap layer closer to the source electrode, and the cap layer may be formed between the gate electrode and the drain electrode.

In still another embodiment of the invention, the cap layer may include a semiconductor layer formed on the electron donor layer and an insulating film formed on the semiconductor layer.

The present invention having the above-described structure enhances a barrier height of Schottky junction, thereby providing a semiconductor device, which is capable of: reducing the leakage current as well as preventing an increase of the source resistance; and/or improving the voltage breakdown level as well as preventing an increase of the source resistance. Moreover, a region occupied by a cap layer between a gate electrode and a drain electrode is made larger. Such a structure allows the voltage breakdown level of a semiconductor device to be improved.

Thus, the invention described herein makes possible the advantages of: (1) providing a semiconductor device (GaN-based heterostructure FET) in which a surface leakage current caused by residual carriers resulting from defects or damage accidentally caused in the interior or surface of the GaN layer is significantly reduced; and (2) providing a semiconductor device (GaN-based heterostructure FET) having a reduced surface leakage current and improved voltage breakdown level.

These and other advantages of the present invention will become apparent to those skilled in the art upon reading and understanding the following detailed description with reference to the accompanying figures.

DETAILED DESCRIPTION

EXAMPLE 1

Figure 9:
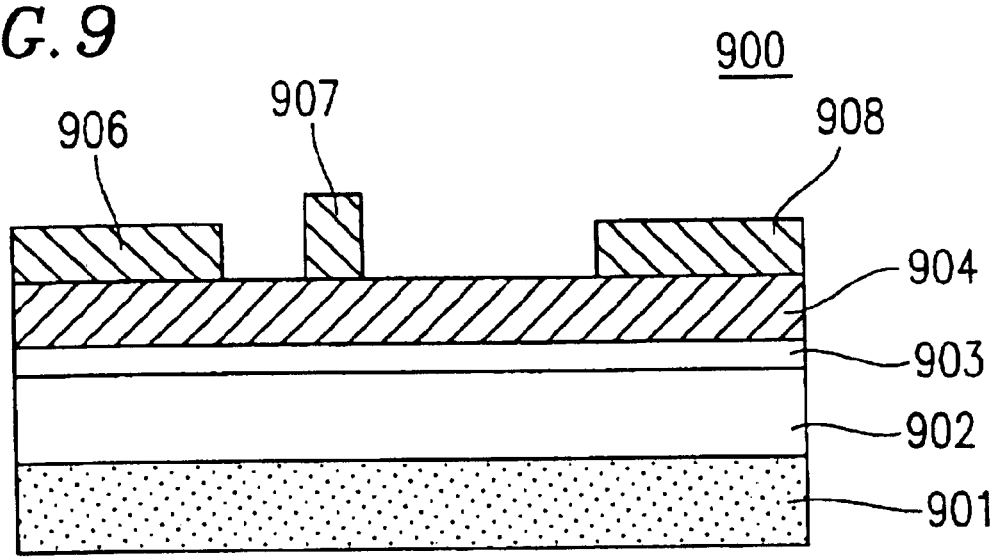
FIG. 9 is a cross-sectional view illustrating a conventional field-effect transistor.

A semiconductor device according to Example 1 of the present invention will be described with reference to the figures. FIG. 9A is a cross-sectional view of a field-effect transistor (FET) 100 according to Example 1 of the present invention and FIG. 1B is a plan view thereof. The field-effect transistor 100 is formed on a substrate 101 composed of sapphire or SiC, on which the following layers are sequentially laminated: a GaN buffer layer 102 having a thickness of about 2–3 $\mu$m; a channel layer 103 formed of GaN or InGaN; an n-type AlGaN electron donor layer 104 having an AlN component ratio of about 0.15 to 0.5, to which an n-type impurity such as Si is added at a density of about $2 \times 10^{18}$ cm$^{-3}$; and a GaN cap layer 105 having a thickness of about 10–20 nm. The GaN cap layer 105 is selectively etched so as to leave only a central portion thereof. A gate electrode 107 is formed on the GaN cap layer 105. A source electrode 106 and a drain electrode 108 are formed, adjacent to the gate electrode 107, on the surface of the AlGaN electron donor layer 104 exposed after portions of the GaN cap layer 105 are removed. The surfaces of each nitride layer are composed of c facets of a III group element.

As shown in FIG. 1B, in the periphery of an element structural region 109, a separation region 110 surrounding the element structural region 109 is formed by means of a method which does not involve etching, e.g., ion implantation. The GaN cap layer 105 is formed in an area which is larger than the gate electrode 107. Moreover, the GaN cap layer 105 is formed so as not to contact the source electrode 106 and the drain electrode 108. The GaN cap layer 105 functions to enhance an effective barrier height (peak potential) of a Schottky electrode, as accounted for by a difference between the magnitude of polarization occurring in the GaN cap layer 105 and that occurring in the AlGaN electron donor layer 104.

Next, the influence of polarization occurring when stress is imposed on the field-effect transistor 100 having the above-described structure will be described.

Since the CaN buffer layer 102 is sufficiently thick to reduce a compression strain due to lattice mismatching, no piezo-polarization occurs due to the strain, but only spontaneous polarization occurs. On the other hand, the AlGaN electron donor layer 104 is subjected to tensile strain, and substantial piezo-polarization occurs therein in addition to the spontaneous polarization. This polarization occurs in a c axis direction of the substrate 101, i.e., a direction perpendicular to the upper surface of the substrate 101. FIG. 2 shows calculation results of theoretical potential along a depth direction, using an interface between the GaN cap layer 105 and the gate electrode 107 of the semiconductor device 100 shown in FIG. 1A as a point of reference (zero distance). The calculation takes into consideration the aforementioned influence from polarization.

In FIG. 2, the thickness of the GaN cap layer 105 is set to 10 nm and a gate voltage is set to OV. A potential difference occurs in the GaN cap layer 105 due to the influence of polarization. As a result, the potential in a heterointerface with the AlGaN electron donor layer 104 (the peak potential shown in FIG. 2) is increased, thereby increasing the effective height of the Schottky barrier.

Figure 3:
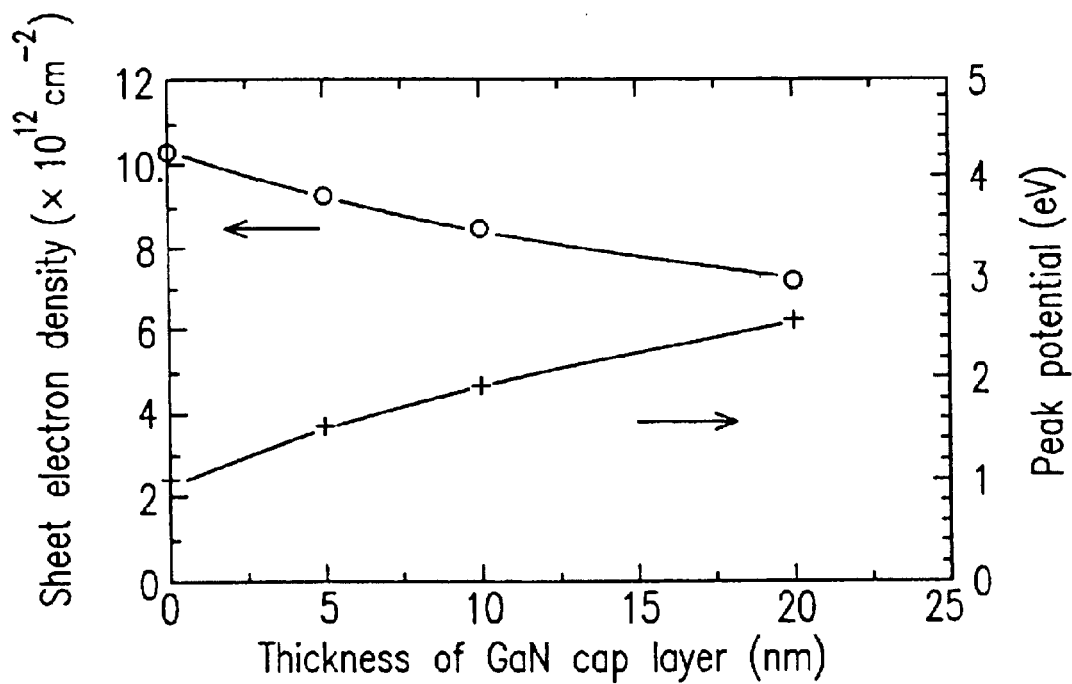
FIG. 3 is a graph showing dependency of sheet electron density and peak potential on a thickness of GaN cap layer relative to Example 1 of the present invention.

FIG. 3 shows calculation results of theoretical changes (marked by x in FIG. 3) in the effective barrier height (peak potential) where the thickness of the GaN cap layer 105 is varied from 0 to 20 nm, and changes (denoted by "O" symbols in FIG. 3) in the electron density accumulating at the heterointerface between the GaN cap layer 105 and the AlGaN electron donor layer 104.

As shown in FIG. 3, while the effectual barrier height (peak potential) of the Schottky electrode gradually increases as the thickness of the GaN cap layer 105 increases, the electron density accumulating in the heterointerface between the GaN cap layer 105 and the AlGaN electron donor layer 104 decreases. The reason why the peak potential increases is that the barrier height of the Schottky electrode to the GaN cap layer 105 remains constant, whereas a potential difference occurring in the GaN cap layer 105 increases along with an increase of a film thickness of the GaN cap layer 105. Thus, the addition of the GaN cap layer 105 effectively increases the peak potential. The electron density decreases as the thickness of the GaN cap layer 105 increases because a reverse bias is applied to the gate electrode by the potential difference residing in the GaN cap layer 105.

As described above, the provision of the GaN cap layer 105 increases the, peak potential and reduces the electron density accumulating at the heterointerface. All of these factors contribute to the high voltage breakdown level of the resultant field-effect transistor. However, the leakage current includes a component which flows along the surfaces of the buffer layer 102. In particular, in the case of a material which creates a donor responsive to depletion of nitrogen atoms on the surfaces, e.g., CaN included in the buffer layer 102, it is important to reduce the aforementioned component in the leakage current. Moreover, a reduction in the electron density accumulating at the heterointerface leads to: an increase of resistance in a region where there is the GaN cap layer 105; an increase of source resistance of the field-effect transistor; and a deterioration in performance of the transistor.

In the field-effect transistor 100 according to the present invention, the GaN cap layer 105 in the region between a gate and a source is removed (i.e., the source electrode 106 and the cap layer 105 do not directly contact each other), thereby further reducing the source resistance. Moreover, the leakage current between the source and the gate, and the leakage current between the gate and the drain can be reduced because the GaN cap layer 105 is removed (i.e., the source electrode 106 and the cap layer 105 do not directly contact each other, and the drain electrode 108 and the cap layer 105 also do not directly contact each other). This is because, as has already been described, the potential increases suddenly along a direction within the plane as indicated by an arrow a in FIG. 1B due to a potential difference occurring in the GaN cap layer 105, so that any electrons contributing to the leakage current will have to acquire a level of energy exceeding such increase in potential level. Electrons have an energy of about 26 meV at room temperature. When the increase in potential level is 260 meV, the leakage current can be decreased by about four orders of magnitude, which is an extremely significant reduction. In fact, as can be seen from the variations in the peak potential in FIG. 3, the provision of the GaN cap layer 105 with a 10 nm thickness, will allow an increase in potential level of about 1 eV to be obtained as compared to the case of not providing the GaN cap layer 105. As a result, a leakage current value is expected to be further reduced.

Figure 4:
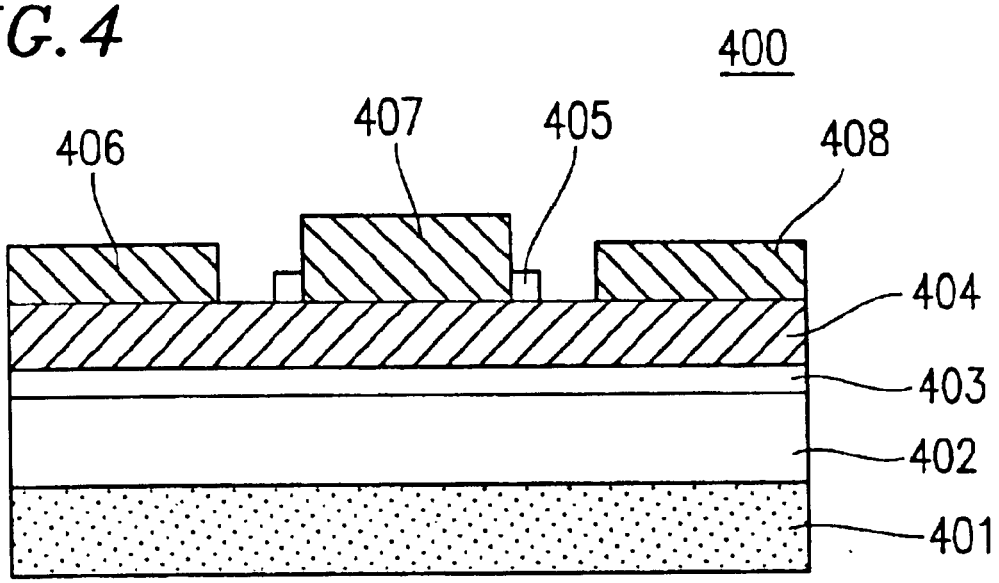
FIG. 4 is a cross-sectional view illustrating a field-effect transistor according to a variant of Example 1 of the present invention.

FIG. 4 shows a field-effect transistor (FET) 400 which is a first variant of Example 1 of the present invention. The field-effect transistor 400 differs from the field-effect transistor 100 described with reference to FIG. 1A in that the field-effect transistor 400 is constructed so that a portion of a GaN cap layer 405 on which a gate electrode 407 is laminated is reduced in thickness or removed altogether by etching. FIG. 4 shows an example of the gate electrode 407 which contacts a current donor layer 404. As described above, the GaN cap layer 405 is reduced in thickness or removed altogether and the gate electrode 407 is laminated in a region where the GaN cap layer has become thin or removed. Therefore, the deterioration of mutual conductance is prevented by the GaN cap layer 405. In this case, although the Schottky barrier height is not enhanced, the increase in potential level along a direction parallel to the interface between the GaN cap layer and the AlGaN electron donor layer contributes to the reduction of the leakage current.

Figure 1A:
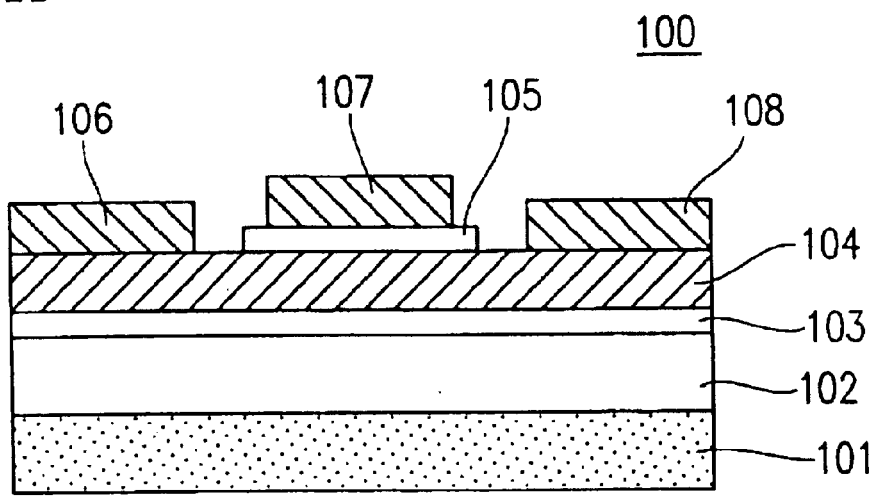
FIG. 1A is a cross-sectional view explaining a field-effect transistor according to Example 1 of the present invention.
Figure 1B:
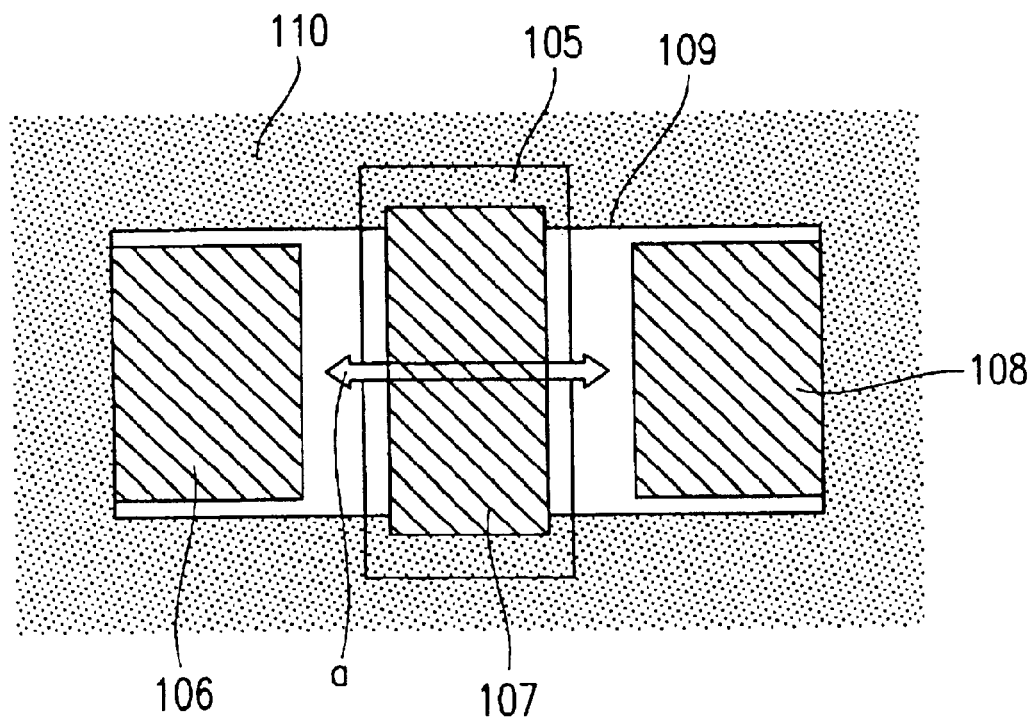
FIG. 1B is a plan view illustrating a field-effect transistor according to Example 1 of the present invention.
Figure 2:
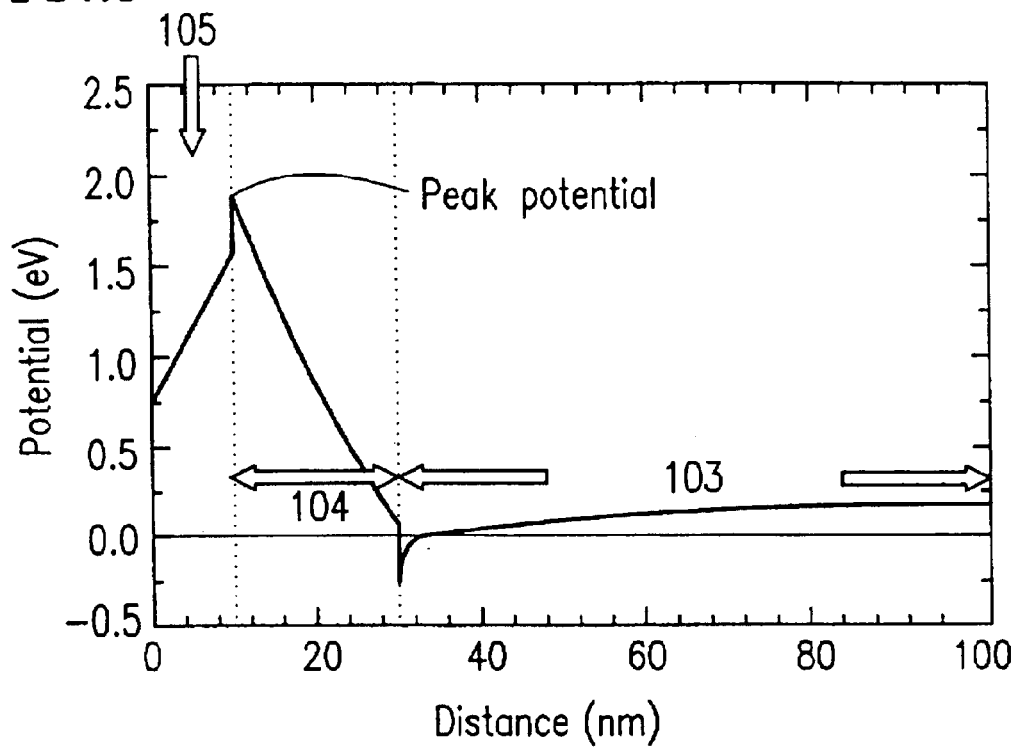
FIG. 2 is a potential graph relative to Example 1 of the present invention.
Figure 5:
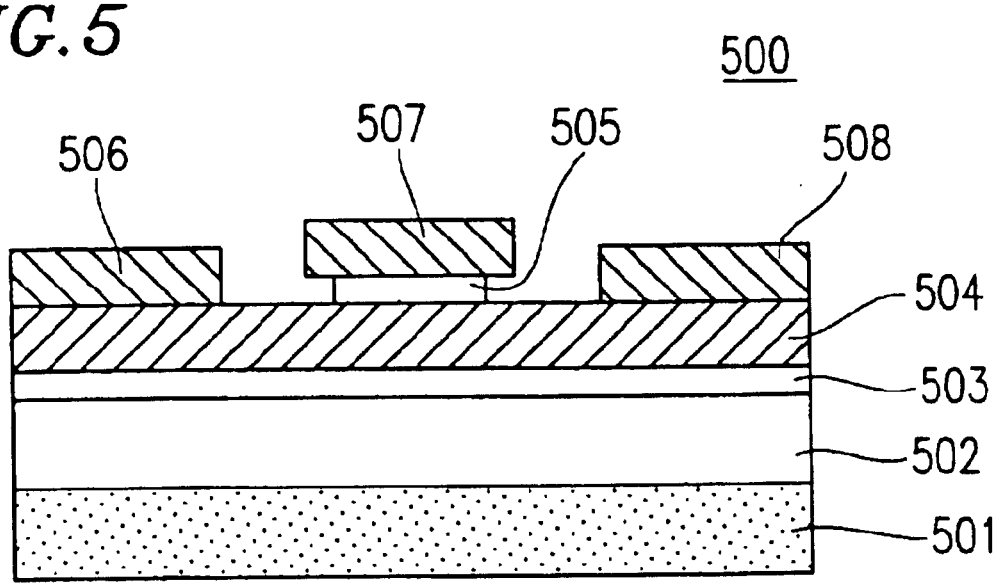
FIG. 5 is a cross-sectional view illustrating a field-effect transistor according to another variant of Example 1 of the present invention.

In the semiconductor device 100 shown FIG. 1A, an example of the surface area of the cap layer 105 which is greater than that of the gate electrode 107 is shown; however, the present invention is not limited to this. FIG. 5 shows a field-effect transistor (FET) 500 according to a second variant of Example 1 of the present invention. The field-effect transistor 500 is different from the field-effect transistor 100 described with reference to FIG. 1A in that a GaN cap layer 505 has a width which is smaller than that of a gate electrode 507. Accordingly, in the field-effect transistor 500, the gate electrode 507 is laminated in a state extending beyond both sides of the GaN cap layer 505. Effects such as reduction in the leakage current and improvement in the voltage breakdown level can be also attained by using this structure.

EXAMPLE 2

FIGS. 6A to 6E show cross-sectional views of field-effect transistors (FET) according to Example 2 of the present invention. Each of the field-effect transistors shown in FIGS. 6A to 6E includes a GaN cap layer 605 in order to improve the voltage breakdown level.

Figure 6A:
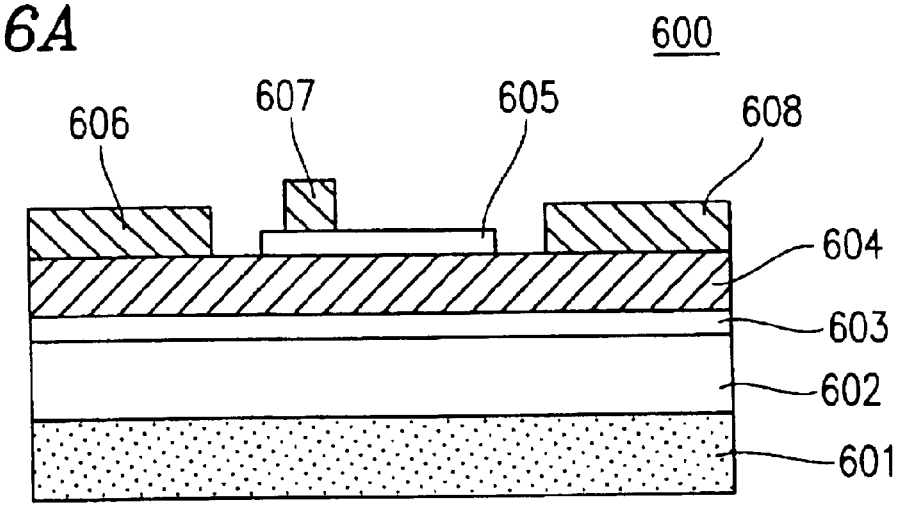
FIG. 6A is a cross-sectional view illustrating a field-effect transistor according to Example 2 of the present invention.

A field-effect transistor (FET) 600 shown in FIG. 6A is different from the field-effect transistor (FET) 100 shown in FIG. 1 in that a gate electrode 607 provided on the GaN cap layer 605 is disposed closer to a source electrode 606. Therefore, a depletion layer extending across a channel layer 603 immediately underlying the gate electrode 607 can be larger on a drain electrode 608 side and the voltage breakdown level of the field-effect transistor 600 can be improved.

Figure 6B:
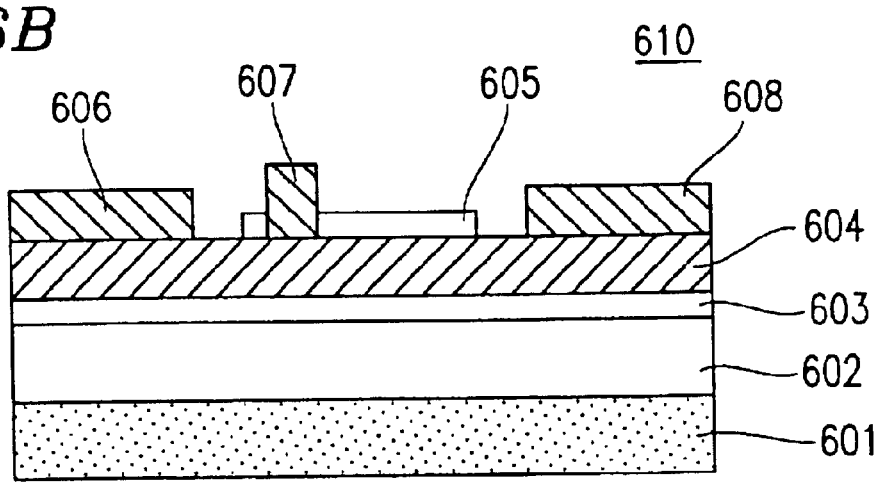
FIG. 6B is a cross-sectional view illustrating a field-effect transistor according to Example 2 of the present invention.

A field-effect transistor 610 shown in FIG. 6B is different from the field-effect transistor 600 shown in FIG. 6A in that the field-effect transistor 610 has a structure in which a portion of the GaN cap layer 605 on which the gate electrode 607 is formed is reduced in thickness or removed altogether by etching. In the field-effect transistor 610 of FIG. 6B, the GaN cap layer is etched so that the gate electrode 607 contacts a current donor layer 604. In the field-effect transistor 610 shown in FIG. 6B, the deterioration of mutual conductance can be prevented by introducing the GaN cap layer 605.

Figure 6C:
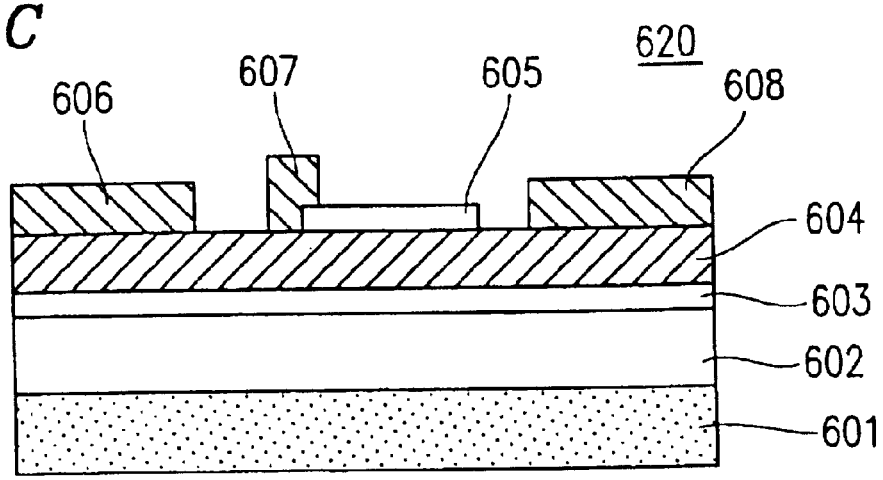
FIG. 6C is a cross-sectional view illustrating a field-effect transistor according to Example 2 of the present invention.
Figure 6D:
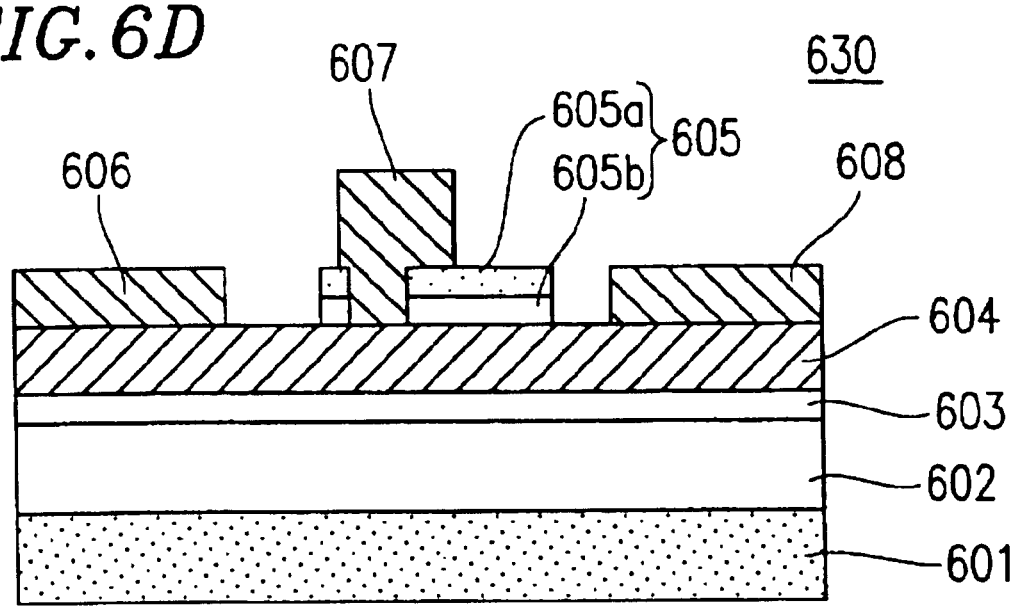
FIG. 6D is a cross-sectional view illustrating a field-effect transistor according to Example 2 of the present invention.
Figure 6E:
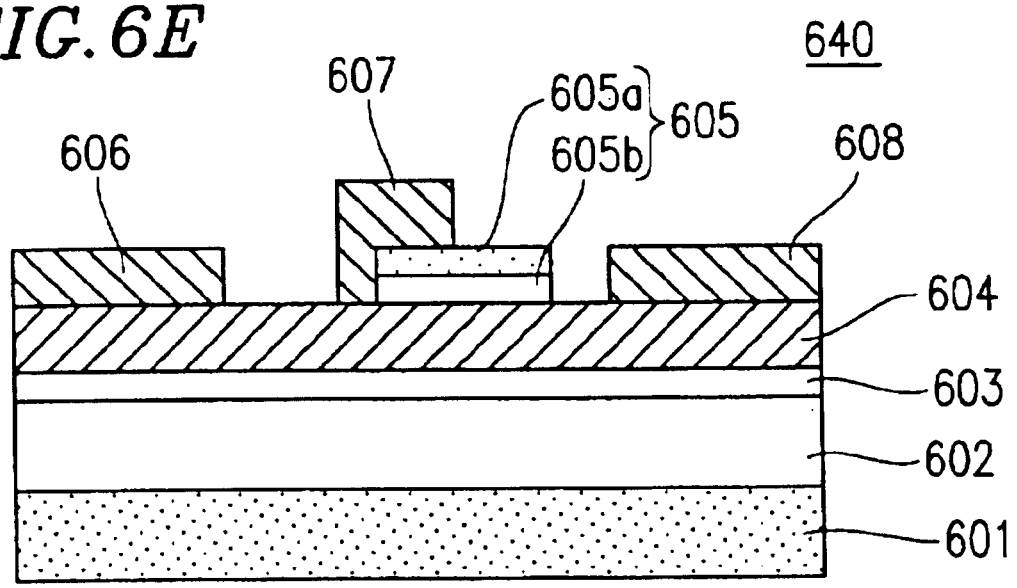
FIG. 6E is a cross-sectional view illustrating a field-effect transistor according to Example 2 of the present invention.

In a field-effect transistor 620 shown in FIG. 6C, the gate electrode 607 is provided on the electron donor layer 604 and along a side edge of the GaN cap layer 605 closer to the source electrode 606. Accordingly, the GaN cap layer 605 is disposed between the gate electrode 607 and the drain electrode 608. In accordance with the structure of the field-effect transistor 620 shown in FIG. 6C, the leakage current between the gate and the source is not improved, but the voltage breakdown level between the gate and the drain is improved. Especially, since the gate electrode 607 is formed along the side edge of the GaN cap layer 605 in a location closer to the source electrode 606, the field concentration in the neighboring area of the gate electrode 607 on the side that is facing the drain can be reduced and the voltage breakdown level between the gate and the drain can be improved. In the same manner as in the field-effect transistor 610 shown in FIG. 6B, an increase of the source resistance can be prevented and the mutual conductance of FET can be improved.

The above-described example illustrates a case where GaN is used as the cap layer 605. However, a GaN cap layer 605 cannot be formed with a relatively large thickness. This is because, as shown in FIG. 3, an increased thickness of GaN makes for insufficient sheet electron density and/or an excessive peak potential so that positive holes may be accumulated between the cap layer 605 and the electron donor layer 604. The need for providing a thick cap layer 605 without substantially affecting the sheet electron density is especially pronounced in the field-effect transistor 620 shown in FIG. 6C. This is because when the cap layer 605 of the field-effect transistor 620 has a large thickness, the field concentration in the neighboring area of the gate electrode 607 on the side that is facing the drain is reduced, and the voltage breakdown level of the field-effect transistor 620 is improved. Moreover, when the cap layer 605 of the field-effect transistor 620 has a large thickness, a parasitic gate capacitance of the portion where the gate electrode 607 overlaps the cap layer 605 can be reduced, and high frequency property of the field-effect transistor 620 can be improved.

There are two methods for providing the thick cap layer 605 maintaining properly lowered sheet electron density as follows. A first method is to use an InGaAlN cap layer instead of using the GaN cap layer 605. A second method is to reduce a potential difference occurring in the cap layer by adding an n-type impurity to the cap layer.

The first method imposes a requirement on the composition of InGaAlN; that is, the lattice constant of the c facet must be substantially matched with that of the GaN buffer layer in order to provide a film having a large thickness. For this purpose, since $In_{0.18}Al_{0.72}N$ and GaN can be lattice matched, a mixed crystal of $In_{0.18}Al_{0.72}N$ with GaN may be formed, resulting in $(In_{0.18}Al_{0.82})_xGa_{1-x}N$. In practice, however some deviation in the composition may be allowed. Another requirement is that the magnitude of polarization inside the InGaAlN cap layer must be kept smaller than that of the polarization occurring in the AlGaN electron donor layer 604. This imposes a constraint on the value of x in $(In_{0.18}Al_{0.82})_xGa_{1-x}N$; the maximum value of x depends on the AlN component in the AlGaN electron donor layer 604. The maximum value of x associated with typical AlN component ratio in the AlGaN electron donor layer 604 can be calculated as follows: when the AlN composition of the AlGaN electron donor layer 604 is 10%, the maximum x value is about 0.16; and when the AlN composition of the AlGaN electron donor layer 604 is 30%, the maximum x value is about 0.47. The maximum x value may be considered to be about 1.5 times the AlN component ratio in the AlGaN electron donor layer 604.

According to the second method, a proper thickness of the cap layer 605 is determined by the density of the impurity added thereto. Although the material of the cap layer may be GaN or InGaAlN, the following description of the second method conveniently assumes that GaN is used. The thickness of the cap layer can be increased under the following conditions while keeping the potential similar to that in FIG. 2 in a region underlying the AlGaN electron donor layer 104 (i.e., a region spanning a distance of 10 nm or more in FIG. 2).

In FIG. 2, the surface potential of the cap layer 105 is fixed to the Schottky barrier height, i.e., 0.76V. An undoped GaN layer can be formed on the cap layer as thickly as possible by performing a doping so as to obtain an electric field which is substantially zero at the surface of the cap layer 105 and which is equal to the potential (about 1.6V) at the interface between the cap layer 105 and the AlGaN electron donor layer 104. Such requirements are calculated to give 16.7 nm as a thickness of the cap layer and $3 \times 10^{18}/cm$ as a doping density of the n-type impurity. An undoped GaN cap layer of a desirable thickness may be formed on such an n-type GaN cap layer.

The above-described structure for the cap layer is merely presented as an exemplary embodiment of the invention, and the actual cap layer can be designed with various combinations of density and thickness. Moreover, as in the field-effect transistors 610 and 620 shown in FIGS. 6B and 6C, when the electrical charge control by means of the gate electrode mainly occurs at a portion where the gate electrode 607 and the field donor layer 604 contact with each other, the cap layer 605 may be composed of a combination of a semiconductor layer 605b (e.g., an n-type GaN layer) with an insulating film 605a formed thereon, as in the field-effect transistors 630 and 640 shown in FIGS. 6D and 6E. A $SiO_2$ film or a silicon nitride film can be used as the insulating film. A silicon nitride film is more preferable because it is considered to have a relatively low interface level density. The field-effect transistor 630 shown in FIG. 6D includes the semiconductor layer 605b and the insulating film 605a provided thereon instead of the cap layer 605 of the field-effect transistor 610 shown in FIG. 6B; and the field-effect transistor 640 shown in FIG. 6E includes the semiconductor 605b and the insulating film 605a provided thereon instead of the cap layer 605 of the field-effect transistor 620 shown in FIG. 6C. In the field-effect transistor 630, the gate electrode 607 is formed so as to contact not only the AlGaN electron donor layer 604, but also the upper surface of the cap layer 605. It will be appreciated that, in the field-effect transistor 610 as well, the gate electrode 607 may be formed so as to contact not only the AlGaN electron donor layer 604 but also the upper surface of the cap layer 605. Particularly, as described above, the voltage breakdown level can be expected to be improved by elongating the gate electrode 607 toward the drain electrode of the cap layer 605.

EXAMPLE 3

In each of the field-effect transistor (FET) structures described in Examples 1 and 2, the facet of the heterostructure is composed of a III group element. However, an alternative structure is required in the case of forming the facet from a V group element. An example of such a heterostructure, the facet of which is composed of nitrogen, a V group element, will be described below.

Figure 7:
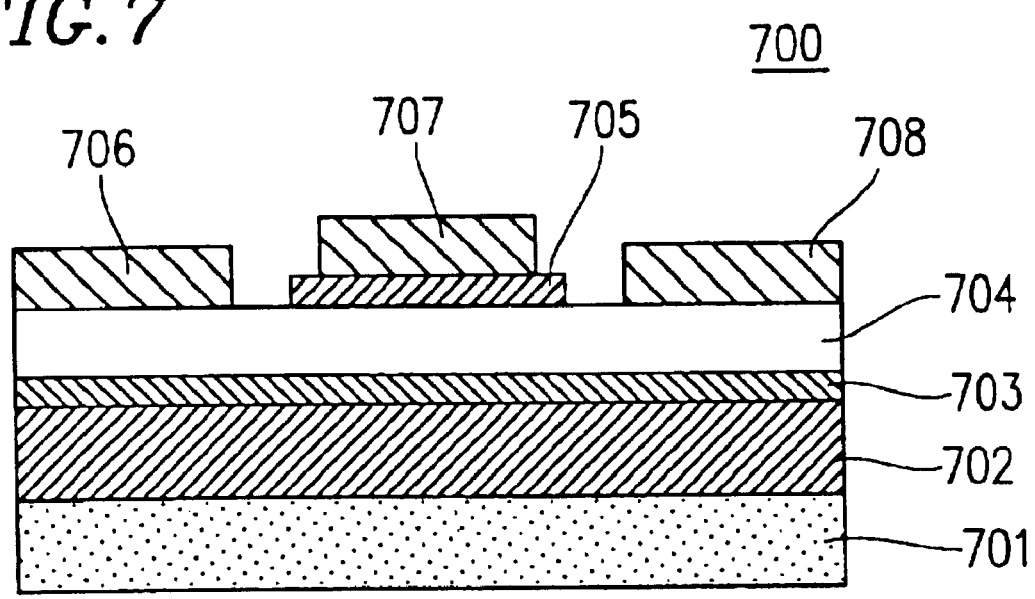
FIG. 7 is a cross-sectional view illustrating a field-effect transistor according to Example 3 of the present invention.

FIG. 7 shows a field-effect transistor 700 as a specific example of the aforementioned structure. The field-effect transistor 700 is formed on a substrate 701 composed of sapphire or SiC, on which the following layers are sequentially laminated: an AlGaN buffer layer 702 having a thickness of about 2 to 3 $\mu$m and an AlN component ratio of about 0.15 to 0.5; an n-type AlGaN electron donor layer 703, to which an n-type impurity such as Si is added at a density of about $2 \times 10^{18}$ cm$^{-3}$; a channel layer 704 formed of GaN or InGaN having a thickness of about 15 to 20 nm; and an AlGaN cap layer 705 having a thickness of about 10 nm. In this field-effect transistor 700, the AlN component ratio of the respective AlGaN layers may be the same. However, when polarization effects are taken into account, the AlN composition of the surface AlGaN cap layer 705 can be prescribed to be greater than the AlN composition of the AlGaN buffer layer 702. As in the field-effect transistor 100 shown in FIG. 1A, the AlGaN cap layer 705 is selectively removed so as to leave only a central portion thereof. A gate electrode 707 is formed on the AlGaN cap layer 705. The source electrode 706 and the drain electrode 708 are formed, adjacent to the gate electrode 707, on the channel layer 704 after the AlGaN cap layer 705 are removed. As described above, the surfaces of each nitride layer are composed of c facets of a V group element (nitrogen).

In the heterostructure field-effect transistor 700 mainly composed of GaN, a set of growth conditions by a molecular beam epitaxy method for forming surfaces of a V group element, has already been reported. When producing a film so that its surfaces will be formed of a V group element, the direction of polarization occurring in each layer is opposite to that in the case where the surfaces are composed of a III group element. Whereas the buffer layer 102 of the field-effect transistor 100 shown in FIG. 1A is composed of GaN, the buffer layer 702 of the field-effect transistor 700 is composed of AlGaN. An electron donor layer 703 including AlGaN to which an n-type impurity such as Si is added and a channel layer 704 are sequentially formed on the buffer layer 702. Electron supply to the channel layer 704 occurs via the AlGaN electron donor layer 703 underlying the channel layer 704 as well as via a positive electrical charge induced by the difference in polarization between the channel layer 704 and the electron donor layer 703. Accordingly, the gate electrode is typically formed directly on this channel layer 704. The AlGaN buffer layer 702 is formed so as to be sufficiently thick so that the lattice strain is reduced. The channel layer 704 including GaN or InGaN is formed so as to be relatively thin, e.g., on the order of tens of nm, since the layer is subjected to a compression strain. As the cap layer 705, AlGaN is used instead of GaN.

Prevention of an increase of the source resistance and reduction of the leakage current are expected from such structure based on the same reason described in Example 1.

A number of variants are possible under Example 2; these variants are shown in FIGS. 8A to 8E in the form of field-effect transistors (FETs). However, in the field-effect transistors shown in FIGS. 8A to 8E, the surfaces of each nitride layer are composed of c facets of a V group element (nitrogen).

Figure 8A:
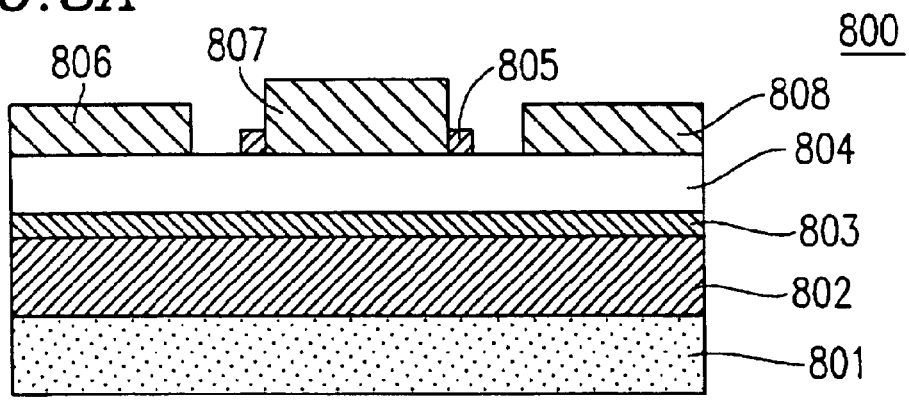
FIG. 8A is a cross-sectional view illustrating a field-effect transistor according to a variant of Example 3 of the present invention.

A field-effect transistor 800 shown in FIG. 8A is constructed, as in the field-effect transistor 400 shown in FIG. 4, so that a portion of an AlGaN cap layer 805 to form a gate electrode 807 is reduced in thickness or removed by etching. Such a structure allows the introduction of the AlGaN cap layer 805 to prevent the deteriorating mutual conductance.

Figure 8B:
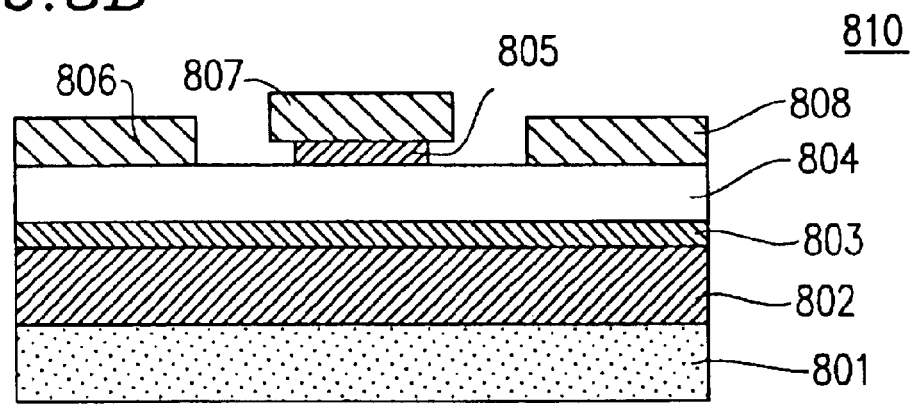
FIG. 8B is a cross-sectional view illustrating a field-effect transistor according to a variant of Example 3 of the present invention.

A field-effect transistor 810 shown in FIG. 8B corresponds to the field-effect transistor 500 shown in FIG. 5. In the field-effect transistor (FET) 810, the gate electrode 807 is formed on the AlGaN cap layer 805, and the AlGaN cap layer 805 has a smaller surface area than that of the gate electrode 807. Accordingly, the AlGaN cap layer 805 is formed so as to be within the bounds of the bottom surface of the gate electrode 807. A reduction of the leakage current and an improvement of the voltage breakdown level are expected by forming the field-effect transistor 810 in the above-described way.

Figure 8C:
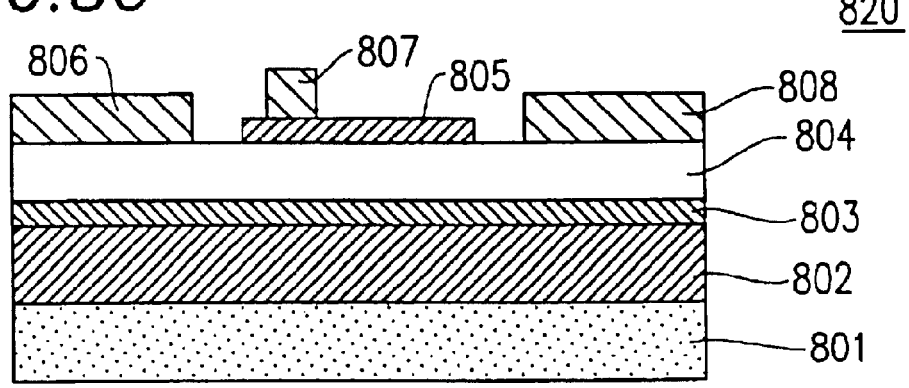
FIG. 8C is a cross-sectional view illustrating a field-effect transistor according to a variant of Example 3 of the present invention.

A field-effect transistor 820 shown in FIG. 8C corresponds to the field-effect transistor 600 shown in FIG. 6A. The field-effect transistor 820 has a gate electrode 807 provided on the AlGaN cap layer 805, at a different position than in the field-effect transistor (FET) 800 shown in FIG. 8A. The region occupied by the ALGaN cap layer 805 between the gate electrode and the drain electrode is made larger by disposing the gate electrode 807 so as to be closer to the source electrode 806. Such a structure allows a depletion layer extending across a channel layer 804 directly underlying the gate electrode 807 to be expanded toward a drain electrode 808 side, and the voltage breakdown level of the field-effect transistor 820 can be improved.

Figure 8D:
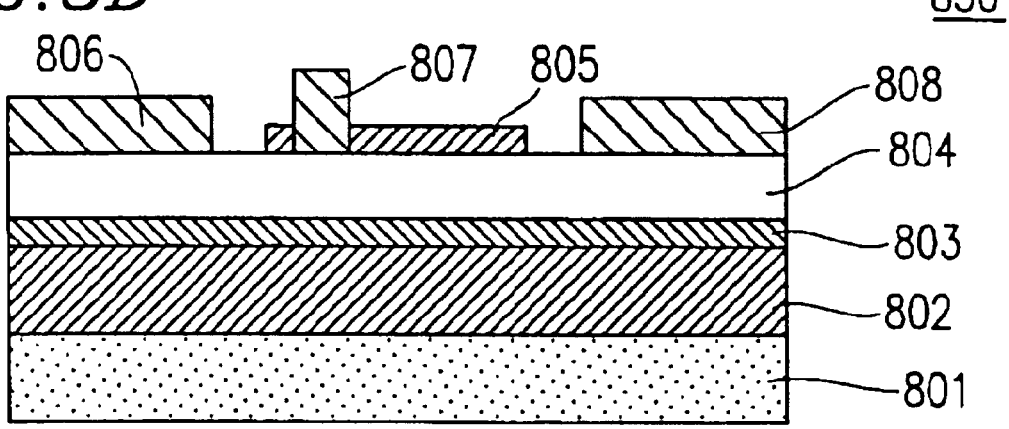
FIG. 8D is a cross-sectional view illustrating a field-effect transistor according to a variant of Example 3 of the present invention.

A field-effect transistor 830 shown in FIG. 8D corresponds to the field-effect transistor 610 shown in FIG. 6B. The field-effect transistor 830 is different from the field-effect transistor 820 shown in FIG. 8C in that a portion of the AlGaN cap layer 805 where the gate electrode 807 is formed is reduced in thickness or removed. As in the structure of the field-effect transistor 830, the deterioration in mutual conductance can be prevented by introducing the AlGaN cap layer 805.

Figure 8E:
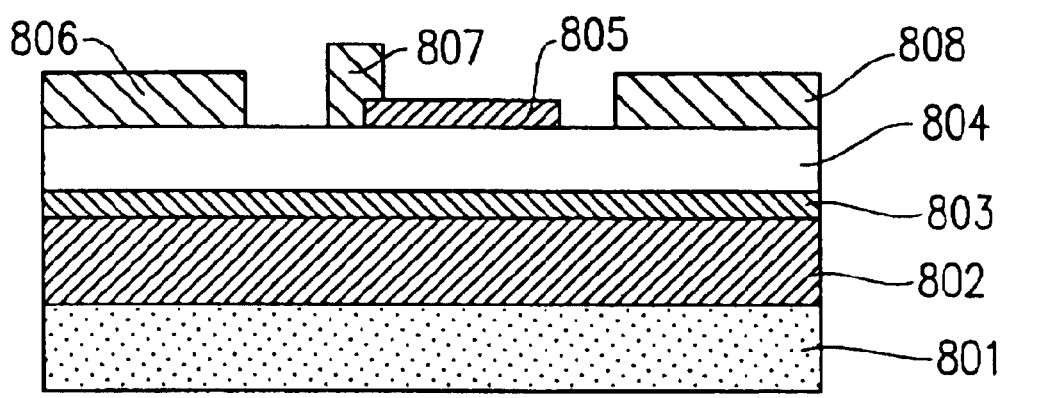
FIG. 8E is a cross-sectional view illustrating a field-effect transistor according to a variant of Example 3 of the present invention.

A field-effect transistor 840 shown in FIG. 8E corresponds to the field-effect transistor 620 shown in FIG. 6C. The field-effect transistor 840 has a structure in which the AlGaN cap layer 805 is provided between the gate electrode 807 and the drain electrode 808. Although the structure of the field-effect transistor 840 may have no significant effect on the improvement in the leakage current between the gate electrode and the source electrode, it does provide for improvement of the voltage breakdown level between the gate electrode and the drain electrode.

Prescribing a large thickness for the cap layer 805 is effective for improving the voltage breakdown level between the gate electrode and the drain electrode in the structure of the field-effect transistor 840. However, when surfaces are composed of a V group element, it is not easy to form a thick cap layer 805 by using any material other than AlGaN. The reason is that, unlike in the case where a facet of the heterostructure is formed of a III group element, due to the compression strain experienced by the GaN composing the channel layer 804 inside the facet, the spontaneous polarization and the polarization caused by piezoelectric effects occur in opposite directions, and as a whole, the polarization occurring inside the GaN channel layer 804 has a considerably small absolute value. No material that results in a small value of the polarization can be found among materials whose lattice constants match that of the AlGaN buffer layer 802 except for AlGaN. Accordingly, it is more convenient and easier to dope the cap layer 805 as described in Example 2 than to form a thick cap layer by using materials other than AlGaN.

Moreover, the use of a combination of an AlGaN layer with an insulating film formed thereon as the cap layer 805, as described in Example 2, is also effective in the structure of the field-effect transistors 830 and 840. An $SiO_2$ film or a silicon nitride film can be used as an insulating film, but the use of a silicon nitride film is more preferable since a nitride silicon film is considered to have a low interface level density.

There have been previous reports on instances in which the GaN buffer layers 102, 402, 502, or 602, and/or the AlGaN buffer layers 702, 802 similar to those described in the present specification are formed on the substrate 101, 401, 501, 601, 701, 801, respectively, with a relatively thin AlN layer (about 100 nm) interposed therebetween. It will be appreciated that the present invention is also applicable to such instance with no substantial changes.

The present invention provides a semiconductor device (field-effect transistor), which is capable of: reducing the leakage current as well as preventing an increase of the source resistance of the gallium nitride-based heterostructure; and/or improving the voltage breakdown level as well as preventing an increase of the source resistance. As a result, it is possible to improve the power characteristics of the semiconductor device of a gallium nitride-based heterostructure.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:

a substrate;

a buffer layer comprising GaN formed on the substrate, wherein surfaces of the buffer layer are c facets of Ga atoms;

a channel layer comprising GaN or InGaN formed on the buffer layer, wherein surfaces of the channel layer are c facets of Ga or In atoms;

an electron donor layer comprising AlGaN formed on the channel layer, wherein surfaces of the electron donor layer are c facets of Al or Ga atoms;

a source electrode and a drain electrode formed on the electron donor layer;

a cap layer comprising GaN or InGaAlN formed between the source electrode and the drain electrode, wherein surfaces of the cap layer are c facets of Ga or In atoms and at least a portion of the cap layer is in contact with the electron donor layer; and a gate electrode formed at least a portion of which is in contact with the cap layer, wherein the gate electrode is formed on the cap layer, and wherein the gate electrode has a surface area which is larger than the cap layer.

* * * * *